(12) United States Patent
Okuda

(10) Patent No.: US 7,719,627 B2
(45) Date of Patent: May 18, 2010

(54) DISPLAY, MOBILE DEVICE, AND METHOD OF MANUFACTURING DISPLAY

(75) Inventor: Tatsumi Okuda, Motosu (JP)

(73) Assignee: Sanyo Electric Co., Ltd., Osaka (JP)

( * ) Notice: Subject to any disclaimer, the term of this patent is extended or adjusted under 35 U.S.C. 154(b) by 1123 days.

(21) Appl. No.: 11/285,751

(22) Filed: Nov. 23, 2005

(65) Prior Publication Data

US 2006/0119760 A1    Jun. 8, 2006

(30) Foreign Application Priority Data

Nov. 26, 2004  (JP)  ............................. 2004-342980
Nov. 30, 2004  (JP)  ............................. 2004-345876

(51) Int. Cl.
    *G02F 1/1333*  (2006.01)
(52) U.S. Cl. ..................... 349/58; 349/149; 349/150; 349/151; 349/152
(58) Field of Classification Search .................. 349/58, 349/150
    See application file for complete search history.

(56) References Cited

U.S. PATENT DOCUMENTS

| | | | | |
|---|---|---|---|---|
| 6,067,133 A | * | 5/2000 | Niibori et al. ................. | 349/60 |
| 6,411,353 B1 | * | 6/2002 | Yarita et al. ................... | 349/59 |
| 2005/0243239 A1 | * | 11/2005 | Kondo et al. .................. | 349/58 |

FOREIGN PATENT DOCUMENTS

JP    3322629    9/1999

* cited by examiner

*Primary Examiner*—David Nelms
*Assistant Examiner*—Thanh-Nhan P Nguyen
(74) *Attorney, Agent, or Firm*—McDermott Will & Emery LLP

(57) ABSTRACT

A display includes: a display panel; a flexible printed circuit board that is attached to the display panel at a first height; and a frame that has the display panel disposed therein. The frame includes a guide portion that pulls the flexible printed circuit board to the outside of the frame, with the height of the flexible printed circuit board being varied from the first height to a second height by bending the flexible printed circuit board.

24 Claims, 14 Drawing Sheets

DISPLAY, MOBILE DEVICE, AND METHOD OF MANUFACTURING DISPLAY

BACKGROUND OF THE INVENTION

1. Field of the Invention

The present invention relates to a display, a mobile device, and a method of manufacturing the display, and more particularly, to a display that has a display panel, a mobile device that includes the display, and a method of manufacturing the display.

2. Cross-Reference To Related Applications

The priority applications Nos. JP2004-342980 and JP2004-345876 upon which this patent application is based are hereby incorporated by reference.

3. Description of the Background Art

An example of a conventional display having a display panel is disclosed in Japanese Patent Publication No. 3322629. More specifically, Japanese Patent Publication No. 3322629 discloses a liquid crystal display unit that has a flexible printed circuit board at the peripheral portion of a glass substrate (a display panel) disposed inside a front case and a rear case. The flexible printed circuit board extends outward through the openings of the front case and the rear case, with the height of the flexible printed circuit board being the same as the height of the portion at which the flexible printed circuit board is attached to the glass substrate.

Conventionally, LCD units having small-sized display panels to be used for mobile phone handsets have been known. FIG. 20 is a perspective view of a conventional LCD unit that has a display panel to be used for a mobile phone handset. FIG. 21 is a perspective cross-sectional view of the LCD unit, taken along the line 300-300 of FIG. 20. FIG. 22 is a cross-sectional view illustrating a situation in which the conventional LCD unit shown in FIG. 20 is disposed inside a mobile phone handset. FIG. 23 is an exploded perspective view of the conventional LCD unit shown in FIG. 20. Referring to FIGS. 20 through 23, the structure of the conventional LCD unit 120 is described.

As shown in FIG. 20, the conventional LCD unit 120 includes an upper frame 101 and a lower frame 102 that are made of metal, an upper deflecting plate 103 that is disposed inside the upper frame 101 and the lower frame 102, and a panel flexible printed circuit board (a panel FPC board) 104 having a thickness of approximately 0.2 mm.

As shown in FIG. 23, the lower frame 102a includes a bottom face portion 102a and four side face portions 102b that extend upward from the four sides of the bottom face portion 102a. The side face portions 102b have protruding portions 102c protruding outward. A notch portion 102d is formed in the side face portion 102b on the side to which the panel FPC board 104 is to be attached. Further, a reflective sheet 105 is disposed above the bottom face portion 102a of the lower frame 102. A resin frame 106 having an opening 106a at the bottom is provided above the reflective sheet 105. In the resin frame 106, a FPC inserting portion 106b through which the panel FPC board 104 is to be inserted is formed at the location corresponding to the notch portion 102d of the lower frame 102. The resin frame 106 also has concave portions 106c at the portion of the opening 106a on the side of the FPC inserting portion 106b of the resin frame 106.

Inside the resin frame 106, a light guide plate 108 for guiding the light from light emitting diodes (LEDs) 107 (see FIGS. 21 and 22) to the entire panel, and two lens sheets 109 are stacked in this order from the bottom, as shown in FIGS. 21 through 23. As shown in FIGS. 21 and 22, the light guide plate 108 has a side face 108a through which the light from the LEDs 107 enters. The lens sheets 109 transmit light upward from the light guide plate 108, and also concentrate the light. A diffusion sheet 110 is provided above the lens sheets 109. This diffusion sheet 110 transmits light upward from the lens sheets 109, and also diffuses the light. With two-sided tape (not shown), a backlight flexible printed circuit board (a backlight FPC board) 111 is bonded to the upper side of the light guide plate 108 through which the light from the LEDs 107 enters. The backlight FPC board 111 has an external connecting portion that protrudes outward from the FPC inserting portion 106b of the resin frame 106. A connector inserting portion 111a (see FIG. 23) is formed at the top end portion of the external connecting portion. The backlight FPC board 111 also has the LEDs 107 that function as backlight sources, as shown in FIGS. 21 and 22. The LEDs 107 are accommodated by the concave portions 106c of the resin frame 106. The LEDs 107 are disposed in such a manner as to emit light toward the light guide plate 108. As shown in FIG. 23, an adhesive layer 112 having an opening 112a is bonded to the peripheral portion of the upper face of the diffusion sheet 110. As shown in FIGS. 21 through 23, a lower deflecting plate 113 is disposed above the adhesive layer 112. Further, a lower glass substrate 114 and an upper glass substrate 115 that are arranged to interpose liquid crystal are provided above the lower deflecting plate 113. Although not shown, a thin-film transistor is formed on the lower glass substrate 114. The glass substrates 114 and 115 including the liquid crystal and the thin-film transistor constitute a display panel. The lower glass substrate 114 has a protruding portion 114a protruding from the lower deflecting plate 113 and the upper glass substrate 115 toward the concave portions 106c of the resin frame 106. The upper deflecting plate 103 is further disposed on the region corresponding to the display region of the glass substrates 114 and 115.

Further, a driver IC (integrated circuit) 116 for driving the display panel and the panel FPC board 104 are mounted onto the upper face of the protruding portion 114a of the lower glass substrate 114. The panel FPC board 104 is electrically connected to the driver IC 116. The panel FPC board 104 is also disposed to protrude outward from the FPC inserting portion 106b of the resin frame 106 and the notch portion 102d of the lower frame 102.

As shown in FIG. 20, an electronic component attaching portion 104a to which electronic components 117 are to be attached is formed at the outward protruding portion of the panel FPC board 104. A connector portion 118 to which the connector inserting portion 111a (see FIG. 23) of the backlight FPC board 111 is to be connected is also attached to the electronic component attaching portion 104a. Further, the connector inserting portion 104b is formed at the end of the electronic component attaching portion 104a. As shown in FIG. 22, the connector inserting portion 104b is connected to a connector portion 131 of the printed circuit board 130 of a mobile phone handset. The printed circuit board 130 is disposed inside an upper chassis 150 and a lower chassis 151 of the mobile phone handset.

As shown in FIGS. 21 through 23, the metal upper frame 101 is disposed above the upper deflecting plate 103. The upper frame 101 includes an upper face portion 101b having an opening 101a, and four side face portions 101c that extend downward from the four sides of the upper face portion 101b. The opening 101a of the upper frame 101 is formed in the area corresponding to the display region of the glass substrates 114 and 115. Further, as shown in FIG. 23, insertion holes 101d through which protruding portions 102c of the lower frame 102 are to be inserted are formed in the side face portions 101c of the upper frame 101. A notch portion 101e is also formed at the location of the side face portion 101c corresponding to the notch portion 102d of the lower frame 102. By virtue of the opening formed with the notch portion 102d of the lower frame 102 and the notch portion 101e of the upper frame 101, the panel FPC board 104 and the backlight FPC board 111 are designed to protrude outward, as shown in FIG. 20.

In the conventional LCD unit 120 illustrated in FIGS. 20 through 23, the panel FPC board 104 attached onto the upper face of the protruding portion 114a of the glass substrate 114 extends to the outside of the upper frame 101 and the lower frame 102, without touching the upper frame 101 and the lower frame 102. Accordingly, the panel FPC board 104 protrudes outside the upper frame 101 and the lower frame 102, at the same height as the protruding portion 114a of the glass substrate 114. As shown in FIG. 22, when the LCD unit 120 is housed in a mobile phone handset including the upper chassis 150 having the inner face portion protruding downward, the electronic components 117 mounted onto the upper face of the panel FPC board 104 are easily brought into contact with the inner face of the upper chassis 150. As a result, the electronic components 117 are often damaged, causing the problem of defective display due to the damage to the electronic components 117. Also, as shown in FIG. 24, a step portion of approximately 0.5 mm to 1.0 mm extending downward or horizontally may be formed out of the panel FPC board 104 having a thickness of approximately 0.2 mm by manually bending the panel FPC board 104. In such a case, however, there are the problems of variations of the position and the shape of the step, and disconnection might be caused. It is also possible to form a step portion out of the panel FPC board 104 with a jig. In this case, however, as the panel FPC board 104 returns to the original shape because of the elasticity, the electronic components 117 are easily damaged, and defective display is caused due to the damage to the electronic components 117.

In the above described liquid crystal display unit disclosed in Japanese Patent Publication No. 3322629, the flexible printed circuit board extends outside the front case and the rear case, at the height of the glass substrate. Therefore, like the conventional LCD unit 120 illustrated in FIGS. 20 through 23, when the liquid crystal display unit is housed inside a mobile phone handset including the upper chassis 150 having a protruding inner face portion, the electronic components attached to the flexible printed circuit board easily come into contact with the inner face of the upper chassis 150. Because of this, the structure disclosed in Japanese Patent Publication No. 3322629 also has the problem that the electronic components are easily damaged.

In the conventional LCD unit 120 illustrated in FIGS. 20 through 23, the driver IC 116 is not attached to the panel FPC board 104, but to the surface of the glass substrate 114 constituting the display panel. Accordingly, the panel FPC board 104 can be made smaller. However, the upper face of the driver IC 116 faces the lower face of the upper face portion 101b of the metal upper frame 101, and therefore, the upper face of the driver IC 116 easily comes into contact with the facing portion of the lower face of the upper face portion 101b of the metal upper frame 101 due to impact or vibration. As a result, the driver IC (an electronic component) 116 is often damaged, and the problem of defective display is caused by the damage to the driver IC (an electronic component) 116.

SUMMARY OF THE INVENTION

A general object of the present invention is to eliminate the above disadvantages.

A more specific object of the present invention is to provide a display and a mobile device that can prevent variations in the shape of the flexible printed circuit board, prevent breaking, and prevent damage to electronic components.

Another specific object of the present invention is to provide a display that has a smaller flexible printed circuit (FPC) board and prevents damage to electronic components, a mobile device including the display, and a method of manufacturing the display.

So as to achieve the above objects, a display in accordance with a first aspect of the present invention includes: a display panel; a flexible printed circuit board that is attached to the display panel at a first height; and a frame that has the display panel disposed therein. The frame includes a guide portion that pulls the flexible printed circuit board to the outside of the frame, with the height of the flexible printed circuit board being varied from the first height to a second height by bending the flexible printed circuit board.

As described above, in the display in accordance with the first aspect of the present invention, the frame has the guide portion that pulls the flexible printed circuit board toward the outside of the frame, with the height of the flexible printed circuit board being varied from the first height to the second height by bending the flexible printed circuit board. Accordingly, the flexible printed circuit (FPC) board can be pulled outward from the frame, at the second height that differs from the first height at which the flexible printed circuit (FPC) board is attached to the display panel. In this case, the guide portion for adjusting the flexible printed circuit board to the second height in conformity with the shape of the inner face of the chassis of a mobile phone handset or the like is provided so as to prevent the flexible printed circuit board from coming into contact with the inner face portion of the chassis. Accordingly, the electronic components attached to the flexible printed circuit board can be prevented from coming into contact with the inner face portion of the chassis. Thus, damage to the electronic components can be avoided. Also, the guide portion that is provided to the frame pulls the flexible printed circuit board toward the outside of the frame, with the height of the flexible printed circuit board being varied from the first height to the second height by bending the flexible printed circuit board. Accordingly, variations in the position and the shape of the step portion can be more effectively restricted than in a case where the step portion is manually formed out of the flexible printed circuit board. Breaking is also prevented. By virtue of the guide portion that pulls the flexible printed circuit board toward the outside of the frame, with the height of the flexible printed circuit board being varied from the first height to the second height by bending the flexible printed circuit board, deformation of the flexible printed circuit board can also be prevented. Thus, damage to the electronic components can be prevented, as the flexible printed circuit board does not return to the original shape.

A mobile device in accordance with a second aspect of the present invention includes the display in accordance with the first aspect. Thus, the second aspect of the present invention can provide a mobile device having a display that can prevent variations in the shape of the flexible printed circuit board, prevent breaking, and avoid damage to the electronic components.

A display in accordance with a third aspect of the present invention includes: a display panel; a first electronic component that is attached to a surface of the display panel; and a frame that secures the display panel. The portion of the frame facing the first electronic component is disposed at a predetermined distance from the first electronic component, and has a concave shape.

As described above, in the display in accordance with the third aspect of the present invention, the portion of the frame facing the first electronic component is formed in the concave shape, so that the distance between the first electronic component and the facing portion of the frame can be made longer. Accordingly, the first electronic component can be prevented from coming into contact with the facing portion of the frame due to impact or vibration. Thus, damage to the first electronic component can be prevented, and defective display cannot be caused by damage to the first electronic component. Furthermore, as the first electronic component is attached to the surface of the display panel, the flexible printed circuit board can be made smaller than in the case where the first electronic component is attached to the flexible printed circuit (FPC) board.

A mobile device in accordance with a fourth aspect of the present invention includes the display in accordance with the third aspect. Thus, the fourth aspect of the present invention can provide a mobile device having a display that has a smaller flexible printed circuit board and prevents damage to electronic components.

A display manufacturing method in accordance with a fifth aspect of the present invention is a method of manufacturing a display that has a metal frame for securing a display panel to which an electronic component is to be attached. This method includes the steps of: preparing the frame; and forming a concave facing portion of the frame facing the electronic component at a predetermined distance through a drawing process.

As described above, the display manufacturing method in accordance with the fifth embodiment includes the step of forming the concave facing portion of the frame facing the electronic component at a predetermined distance through a drawing process. Accordingly, the distance between the electronic component and the facing portion of the frame can be made longer, and the electronic component can be prevented from coming into contact with the facing portion of the frame due to impact or vibration. Thus, damage to the electronic component can be prevented, and defective display cannot be caused by damage to the electronic component. Furthermore, as the electronic component is attached to the surface of the display panel, the flexible printed circuit board can be made smaller than in the case where the electronic component is attached to the flexible printed circuit board.

DETAILED DESCRIPTION OF THE PREFERRED EMBODIMENTS

The following is a description of embodiments of the present invention, with reference to the accompanying drawings.

Referring first to FIGS. 1 through 11, the structure of a LCD unit 60 in accordance with an embodiment of the present invention is described. In this embodiment, the LCD unit 60 is described as an example of the "display" in the claims.

Figure 1:
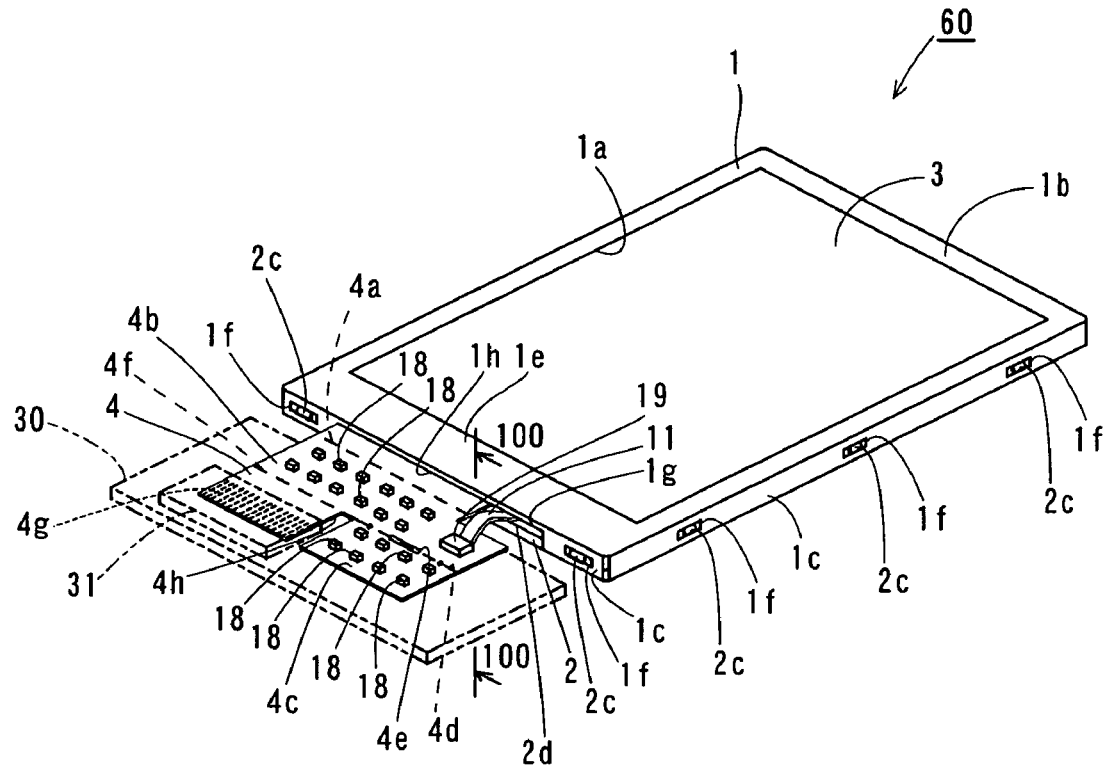
FIG. 1 is a perspective view of a LCD unit having a display panel in accordance with an embodiment of the present invention.
Figure 2:
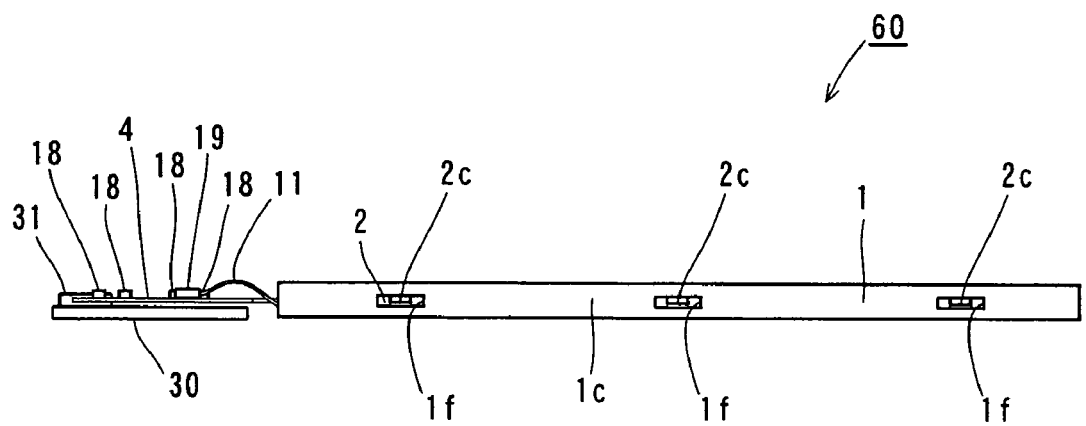
FIG. 2 is a side view of the LCD unit in accordance with the embodiment, where the LCD unit is mounted to a substrate.

As shown in FIGS. 1 and 2, the LCD unit 60 in accordance with this embodiment includes an upper frame 1 and a lower frame 2 that are formed with metal plates, an upper deflecting plate 3 (see FIG. 1) that is disposed inside the upper frame 1 and the lower frame 2, and a panel flexible printed circuit board (panel FPC board) 4 with a thickness of approximately 0.2 mm. The upper frame 1 is an example of the "first frame" or the "frame" in the claims, and the panel FPC board 4 is an example of the "flexible printed circuit board" in the claims.

Figure 5:
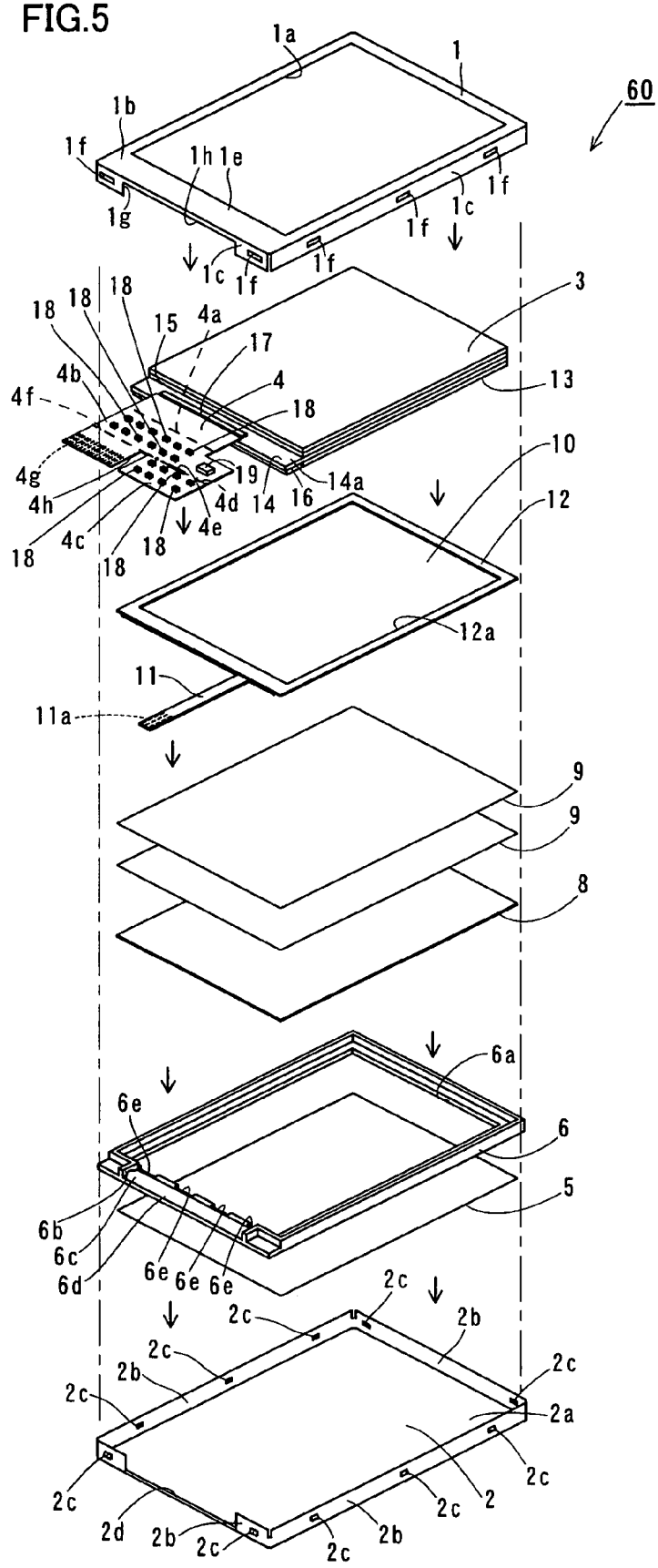
FIG. 5 is an exploded perspective view of the LCD unit in accordance with the embodiment shown in FIG. 1.

As shown in FIG. 5, the lower frame 2 made of metal includes a bottom face portion 2a and four side face portions 2b that extend upward from the four sides of the bottom face portion 2a. Each of the side face portions 2b has protruding portions 2c extending outward. A notch portion 2d is formed in the side face portion 2b on the side at which the panel FPC board 4 is to be disposed. A reflective sheet 5 is disposed over the bottom face portion 2a of the lower frame 2. A resin frame 6 having an opening 6a at the bottom is disposed on the reflective sheet 5. The resin frame 6 is an example of the "second frame" in the claims. In the resin frame 6, a FPC inserting portion 6b through which the panel FPC board 4 is to be inserted is formed at the portion corresponding to the notch portion 2d of the lower frame 2.

Figure 3:
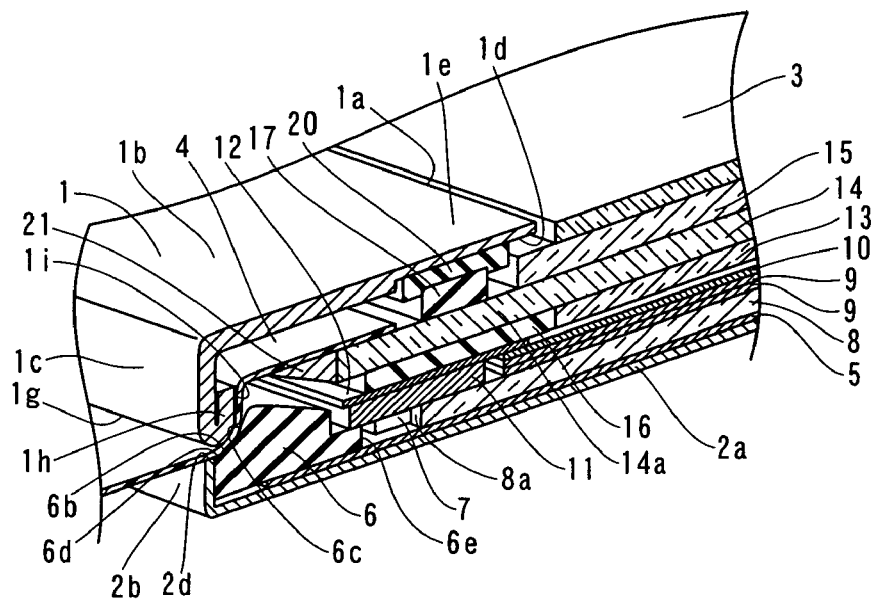
FIG. 3 is a perspective cross-sectional view of the LCD unit, taken along the line 100-100 of FIG. 1.
Figure 4:
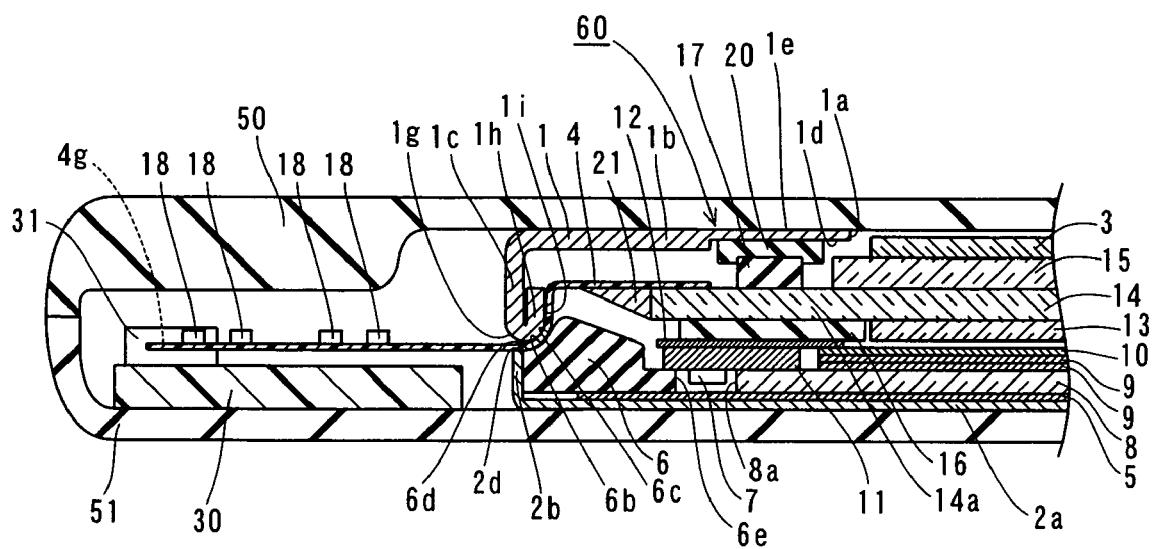
FIG. 4 is a cross-sectional view of the LCD unit in accordance with the embodiment shown in FIG. 1, where the LCD unit is mounted in a mobile phone handset.
Figure 6:
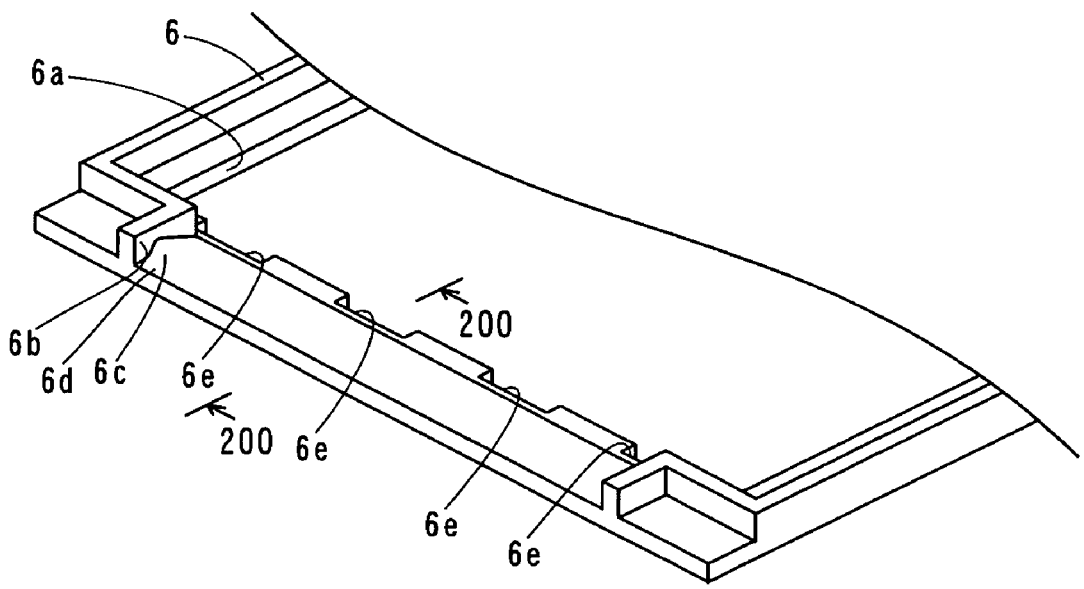
FIG. 6 is a perspective view illustrating the structure of the resin frame of the LCD unit in accordance with the embodiment shown in FIG. 1.
Figure 7:
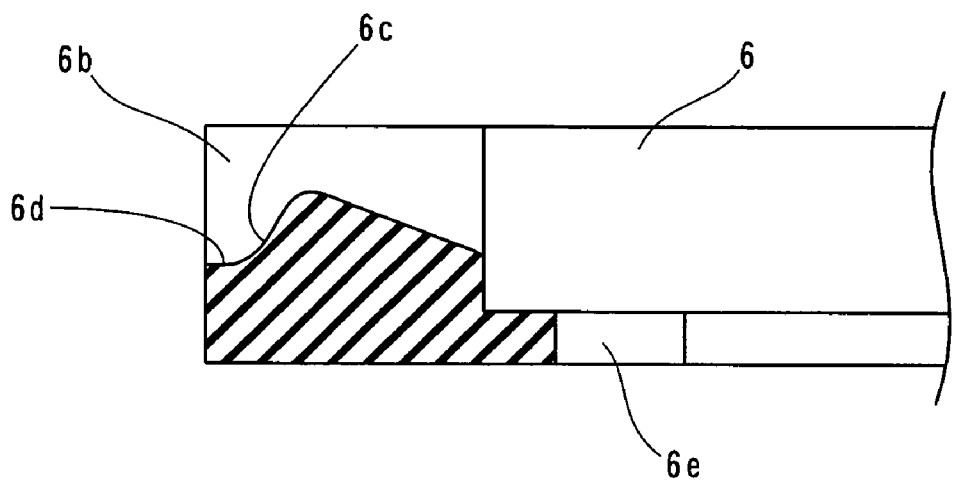
FIG. 7 is a cross-sectional view of the LCD unit, taken along the line 200-200 of FIG. 6.

In this embodiment, a guide face 6c having an arc-like portion that is concaved downward so as to accommodate the lower face of the panel FPC board 4 (see FIGS. 3 and 4) is integrally formed with the upper face of the FPC inserting portion 6b of the resin frame 6, as shown in FIGS. 3, 4, and 6. The guide face 6c is an example of the "second guide portion" in the claims. As shown in FIGS. 6 and 7, a horizontal face portion 6d for horizontally guiding the panel FPC board 4 to the outside is formed outside the arc-like portion of the guide face 6c. As shown in FIG. 6, in the resin frame 6, concave portions 6e (four of them in this embodiment) for accommodating the LEDs 7 as backlight sources described later are formed at the FPC inserting portion 6b on the side of the opening 6a.

Figure 8:
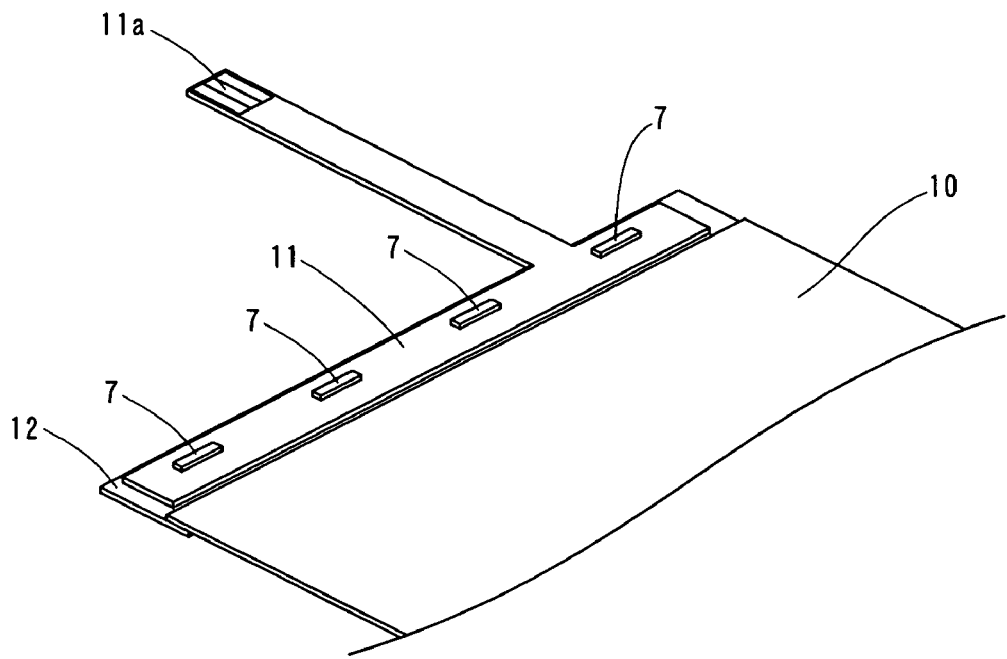
FIG. 8 is a perspective view illustrating the structure of the backlight FPC board of the LCD unit in accordance with the embodiment shown in FIG. 1.

Inside the resin frame 6, a light guide plate 8 for guiding the light from the LEDs 7 to the entire panel and two lens sheets 9 are disposed in this order from the bottom, as shown in FIG. 5. The light guide plate 8 is disposed to horizontally face the LEDs 7, and has a side face 8a through which the light from the LEDs 7 enters, as shown in FIGS. 3 and 4. The lens sheets 9 transmit light upward from the light guiding plate 8, and have the function of gathering light. Also, a diffusion sheet 10 is disposed over the lens sheets 9. The diffusion sheet 10 transmits light upward from the lens sheets 9, and has the function of diffusing light. A backlight flexible printed circuit board (backlight FPC board) 11 is attached to the lower face (the bottom face) of part of the diffusion sheet 10. The backlight FPC board 11 has an external connecting portion that extends outward from the FPC inserting portion 6b of the resin frame 6, and a connector inserting portion 11a is provided at the edge of the external connecting portion, as shown in FIG. 5. As shown in FIG. 8, the backlight FPC board 11 also has LEDs 7 (four of them in this embodiment) that function as the backlight sources arranged at predetermined intervals.

As shown in FIGS. 3 and 4, the four LEDs 7 are accommodated by the four concave portions 6e of the resin frame 6. The four LEDs 7 are disposed so as to emit light toward the light guide plate 8. As shown in FIG. 5, an adhesive layer 12 having an opening 12a is bonded to the peripheral region along the hems of the upper face of the diffusion sheet 10. A lower deflecting plate 13 is disposed over the adhesive layer 12. A lower glass substrate 14 and an upper glass substrate 15 that have liquid crystal interposed between them are disposed over the lower deflecting plate 13. A thin-film transistor (not shown) is formed on the lower glass substrate 14. The glass substrates 14 and 15, together with the liquid crystal and the thin-film transistor, constitute a display panel. As shown in FIGS. 3 and 4, the location (the first height) of the upper face of the lower glass substrate 14 is higher than the location (the second height) of the horizontal face portion 6d of the guide face 6c of the resin frame 6. Also, the lower glass substrate 14 has a protruding portion 14a protruding from the lower deflecting plate 13 and the upper glass substrate 15 toward the concave portions 6e (a side) of the resin frame 6. The upper deflecting plate 3 is disposed over the region corresponding to the display region of the glass substrates 14 and 15.

Figure 9:
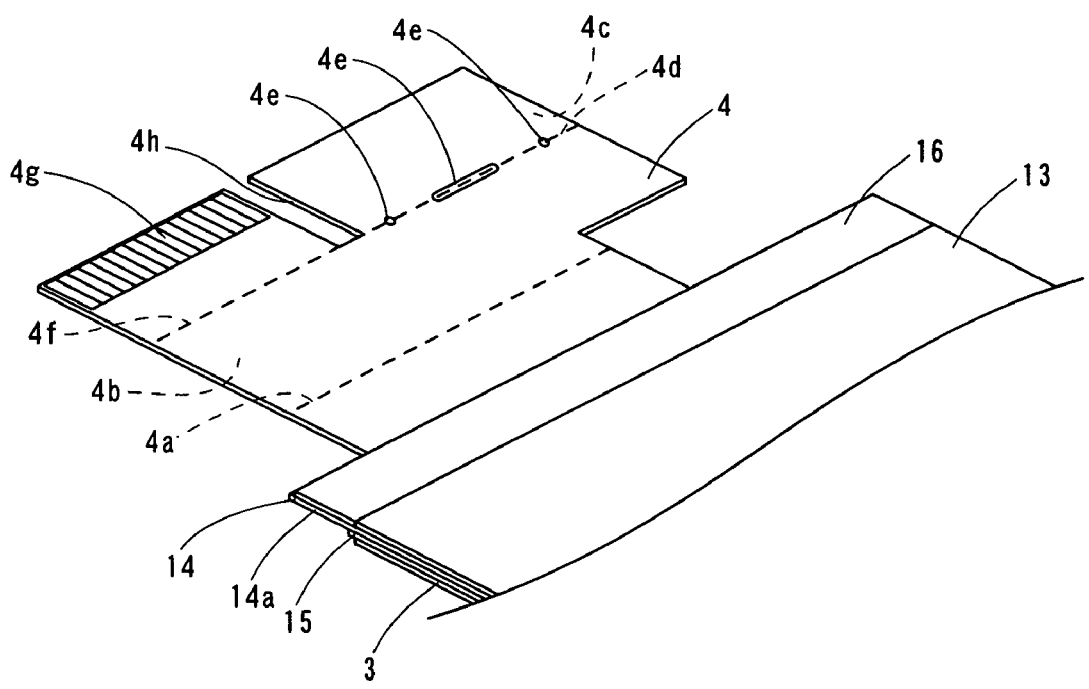
FIG. 9 is a perspective view illustrating the structure of the glass substrates of the LCD unit in accordance with the embodiment shown in FIG. 1.

As shown in FIGS. 3, 4, and 9, a light shielding member 16 that is made of a resin material such as polycarbonate having a light shielding effect is fixed to the lower face of the protruding portion 14a of the lower glass substrate 14 with an adhesive layer (not shown). This light shielding member 16 is black and functions as a spacer. The light shielding member 16 is in contact with a side face of the lower deflecting plate 13, and is designed to have the same thickness as the lower deflecting plate 13. Accordingly, the protruding portion 14a of the lower glass substrate 14 is supported by the light shielding member 16, as shown in FIGS. 3 and 4. Thus, the protruding portion 14a of the glass substrate 14 can be prevented from breaking on impact. As shown in FIGS. 3 and 4, the light shielding member 16 is provided to cover the upper portion of the side face 8a of the light guide plate 8 through which the light from the LEDs 7 enters. As shown in FIG. 4, the light shielding member 16 is also provided so that the light from the LEDs 7 and the light emitted from the LEDs 7 onto the side face 8a of the light guide plate 8 and reflected by the side face 8a of the light guide plate 8 can be prevented from entering a driver IC 17 that will be described later. Also, the light shielding member 16 is provided so that the light from the LEDs 7 and the light emitted from the LEDs 7 onto the side face 8a of the light guide plate 8 and reflected by the side face 8a of the light guide plate 8 can be prevented from traveling outward via the opening 1a of the upper frame 1 described later.

In this embodiment, the driver IC 17 for driving the display panel at the height of the upper face of the lower glass substrate 14 (the first height) and the panel FPC board 4 are attached onto the upper face of the protruding portion 14a of the lower glass substrate 14. Accordingly, the driver IC 17 is disposed in the regions other than the region in which the upper deflecting plate 3 is disposed on the surface of the display panel formed with the glass substrates 14 and 15. Thus, the driver IC 17 can be disposed outside the display region of the glass substrate 14. The driver IC 17 is an example of the "first electronic component" in the claims. The panel FPC board 4 is electrically connected to the driver IC 17. The panel FPC board 4 is designed to protrude from the FPC inserting portion 6b of the resin frame 6 and the notch portion 2d of the lower frame 2. A UV resin portion 21 for preventing the panel FPC board 4 from detaching from the lower glass substrate 14 is provided on side faces of the panel FPC board 4 and the lower glass substrate 14.

In this embodiment, the outward extending portion of the panel FPC board 4 is designed to horizontally extend at the height of the horizontal face portion 6d of the guide face 6c of the resin frame 6 (the second height). As shown in FIGS. 5 and 9, the panel FPC board 4 has a bending portion 4a on the side of the glass substrate 14. The bending portion 4a is an example of the "first bending portion" in the claims. As shown in FIG. 1, electronic component attaching portions 4b and 4c to which electronic components 18 are attached are formed outside the bending portion 4a of the panel FPC board 4. The electronic components 18 are an example of the "second electronic component" in the claims, and the electronic component attaching portions 4b and 4c are examples of the "first electronic component attaching portion" and the "second electronic component attaching portion". A connector portion 19 to which the connector inserting portion 11a (see FIG. 5) of the backlight FPC board 11 is to be connected is also attached to the electronic component attaching portion 4b of the panel FPC board 4. Further, a bending portion 4d and a bending hole 4e (see FIG. 9) are formed between the electronic component attaching portion 4b and the electronic component attaching portion 4c. The bending portion 4d is an example of the "third bending portion" in the claims. The bending hole 4e functions to facilitates the bending at the bending portion 4d. Further, a bending portion 4f is formed outside the electronic component attaching portion 4b of the panel FPC board 4. The bending portion 4f is an example of the "second bending portion" in the claims. The bending portions 4a, 4d, and 4f of the panel FPC board 4 are designed to be thinner than any other portion of the panel FPC board 4. Accordingly, the panel FPC board 4 can be easily bent at the bending portions 4a, 4d, and 4f. Further, a connector inserting portion 4g is provided outside the bending portion 4f. The connector inserting portion 4g is an example of the "connector inserting portion" in the claims. A slit 4h is formed between the connector inserting portion 4g and the electronic component attaching portion 4c. With this arrangement, the connector inserting portion 4g and the electronic component attaching portion 4c can be bent independently of each other. In the situation illustrated in FIGS. 1 and 2, the connector inserting portion 4g is connected to a connector portion 31 to be attached to the printed circuit board 30 of a mobile phone handset.

As shown in FIGS. 3 through 5, the upper frame 1 made of metal with a thickness of approximately 0.4 mm is disposed on the upper deflecting plate 3. The upper frame 1 includes an upper face portion 1b having an opening 1a, and four side face portions 1c that extend downward from the four sides of the upper face portion 1b. The opening 1a of the upper frame 1 is formed in the area corresponding to the display region of the glass substrates 14 and 15.

Figure 10:
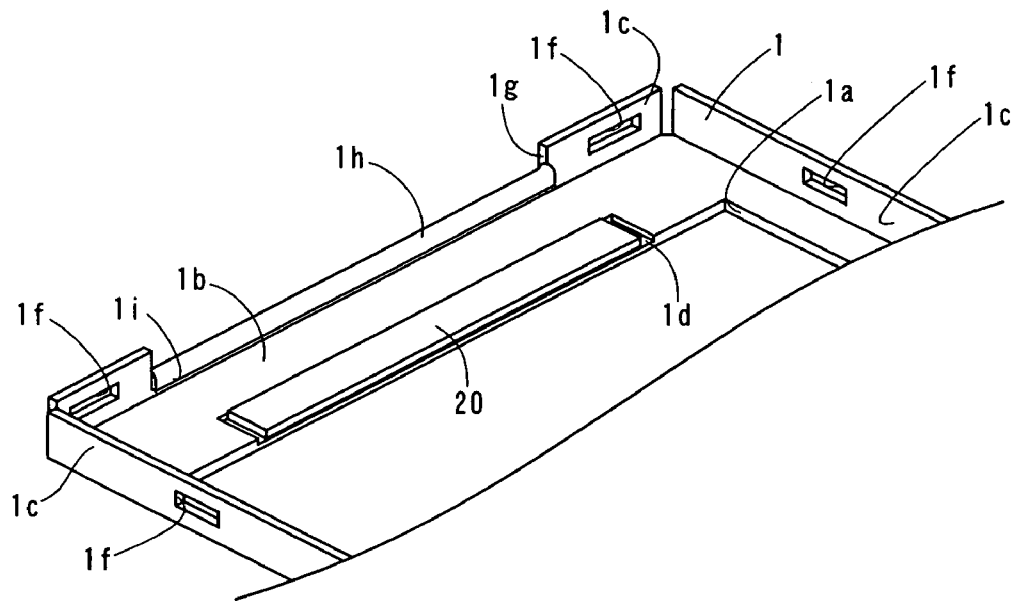
FIG. 10 is a perspective view illustrating the structure of the upper frame of the LCD unit in accordance with the embodiment shown in FIG. 1.
Figure 11:
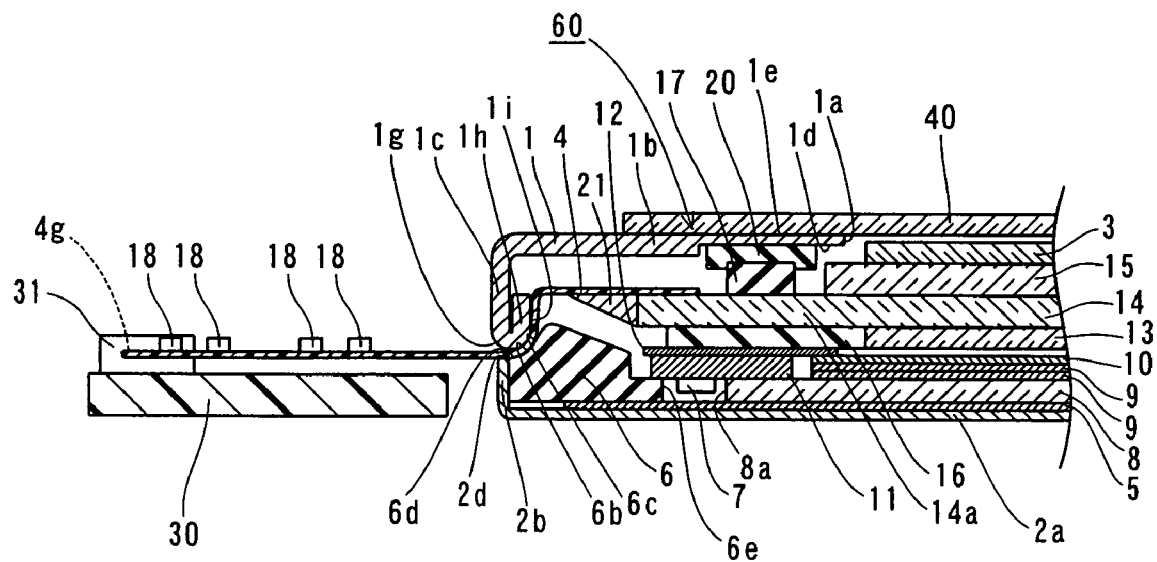
FIG. 11 is a cross-sectional view illustrating a situation in which a touch panel is placed on the upper frame of the LCD unit in accordance with the embodiment shown in FIG. 1.
Figure 12:
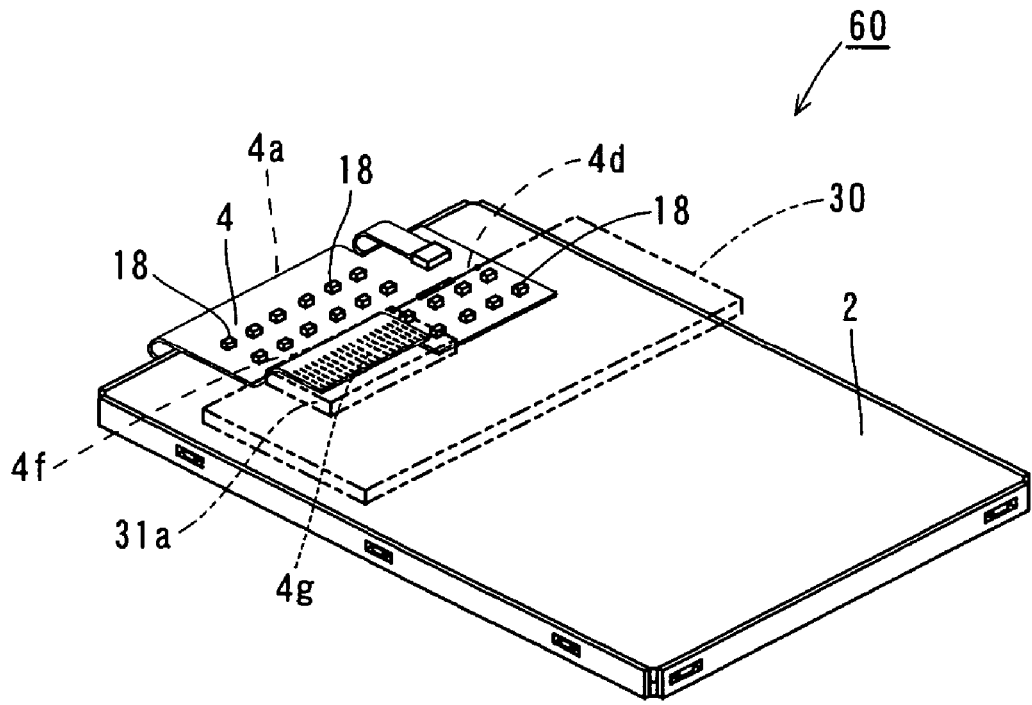
FIG. 12 is a perspective view of a LCD unit in accordance with a first modification of the embodiment of the present invention, where the LCD unit is mounted to the printed circuit board of a mobile phone handset.
Figure 13:
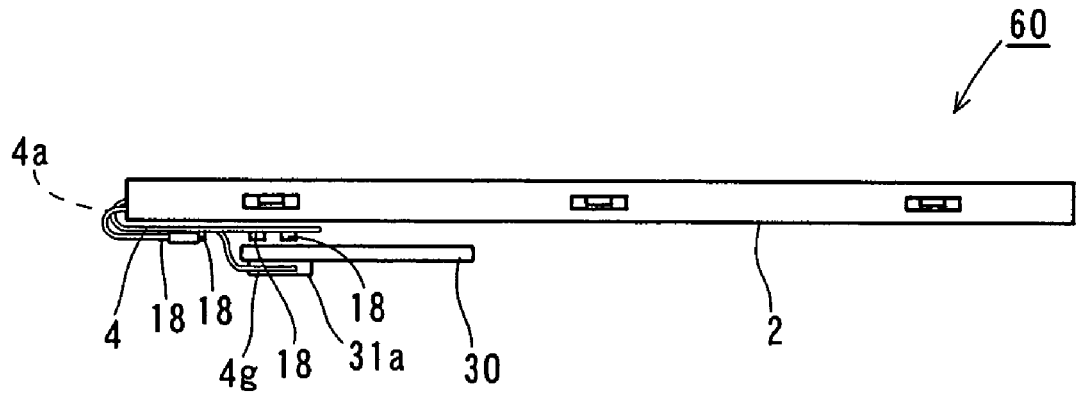
FIG. 13 is a side view of the LCD unit in accordance with the first modification shown in FIG. 12, where the LCD unit is mounted to the printed circuit board of a mobile phone handset.
Figure 14:
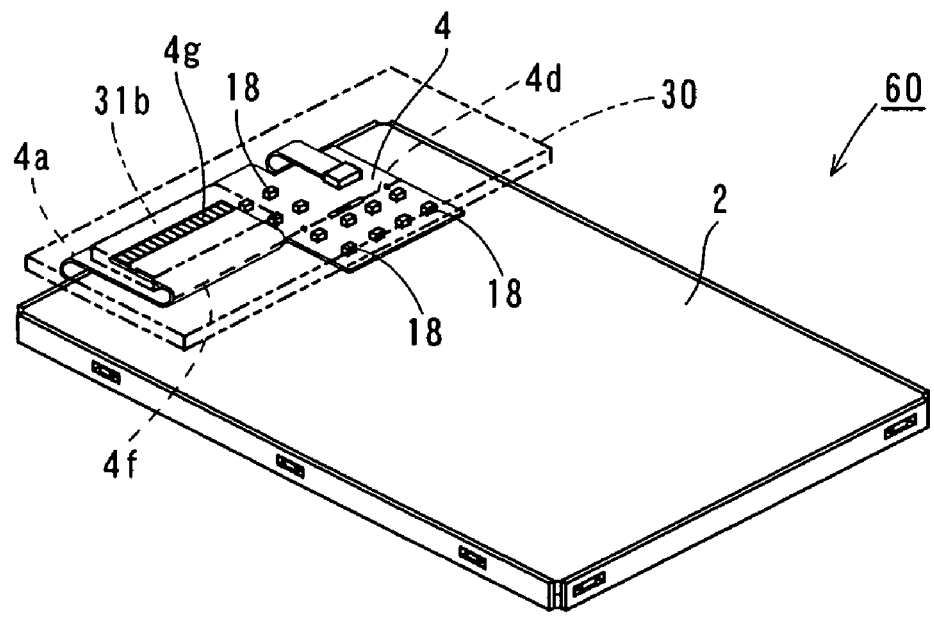
FIG. 14 is a perspective view of a LCD unit in accordance with a second modification of the embodiment of the present invention, where the LCD unit is mounted to the printed circuit board of a mobile phone handset.
Figure 15:
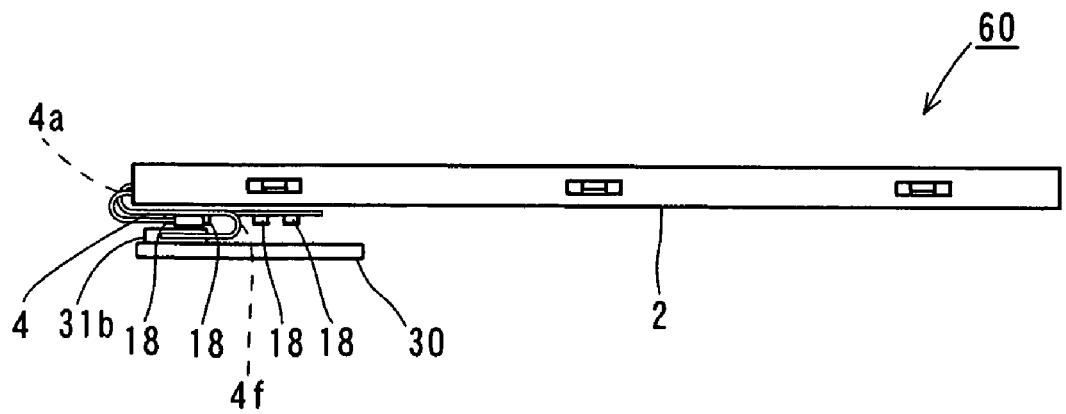
FIG. 15 is a side view of the LCD unit in accordance with the second modification shown in FIG. 14, where the LCD unit is mounted to the printed circuit board of a mobile phone handset.
Figure 16:
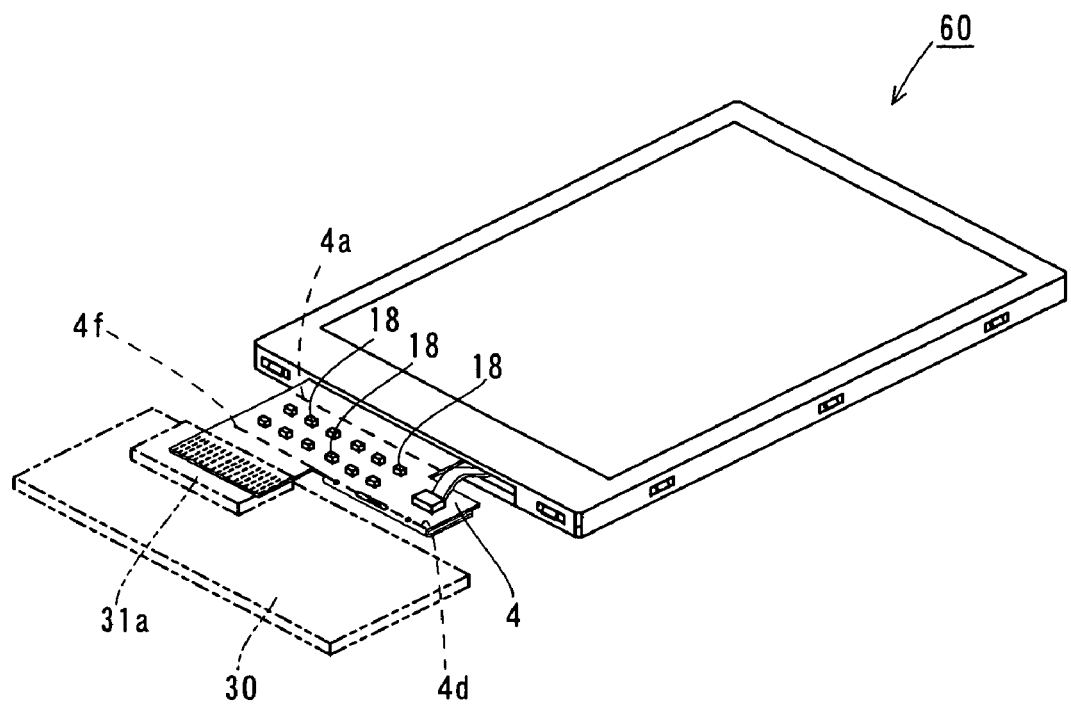
FIG. 16 is a perspective view of a LCD unit in accordance with a third modification of the embodiment of the present invention, where the LCD unit is mounted to the printed circuit board of a mobile phone handset.
Figure 17:
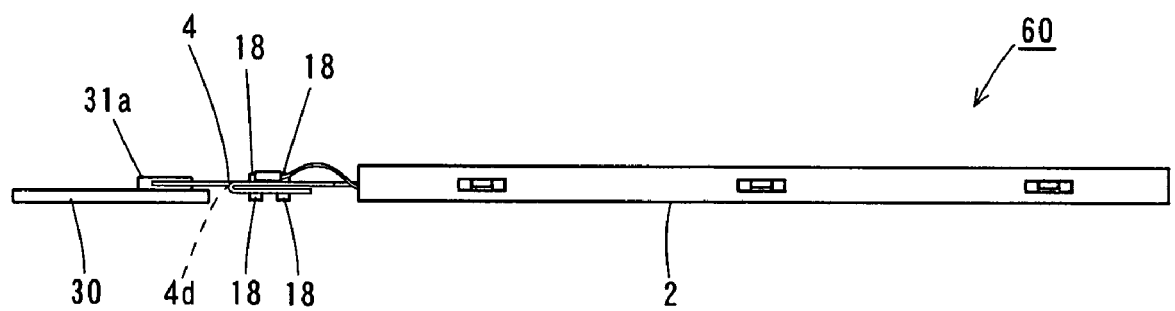
FIG. 17 is a side view of the LCD unit in accordance with the third modification shown in FIG. 16, where the LCD unit is mounted to the printed circuit board of a mobile phone handset.

As shown in FIGS. 3, 4, and 10, a facing portion 1d that has a concave shape is formed in the region corresponding to the region of the driver IC 17 under the upper face portion 1b. The facing portion 1d with the concave shape has a smaller thickness (approximately 0.2 mm) than the thickness of the rest of the upper frame 1 (approximately 0.4 mm). The facing portion 1d with the concave shape is formed through a drawing process. The drawing process is carried out using a progressive die at the same time as the process of forming the rest of the upper frame 1. Also, an upper face portion 1e corresponding to the concave facing portion 1d on the lower face of the upper frame 1 has a flat face, as shown in FIGS. 1, 3, and 4. With this arrangement, the upper face portion 1e of the upper frame 1 can be prevented from protruding upward, and accordingly, the upper frame 1 can be prevented from becoming taller. As a result, it becomes easier to attach a device such as a touch panel 40 onto the upper face portion 1e of the upper frame 1, as shown in FIG. 11, and the attachment of the touch panel 40 is not hindered by an increase of the height of the upper frame 1.

As shown in FIGS. 3, 4, and 10, a buffer member 20 that is made of a sponge material having a thickness of approximately 0.2 mm to 0.3 mm is attached onto the facing portion 1d of the upper frame 1 via an adhesive layer (not shown). This buffer member 20 is disposed so that the upper face of the driver IC 17 bites into the lower face of the buffer member 20, with the upper frame 1 being attached to the structure, as shown in FIGS. 3 and 4.

As shown in FIG. 5, the side face portions 1c of the upper frame 1 has insertion holes 1f through which the protruding portions 2c of the lower frame 2 are to be inserted. The side face portions 1c also have a notch portion 1g formed at the location corresponding to the notch portion 2d of the lower frame 2.

As shown in FIGS. 3 and 4, a folding portion 1h is formed inside the notch portion 1g. The folding portion 1h is an example of the "first guide portion" in the claims. In practice, the folding portion 1h is designed to fold back 180 degrees. Accordingly, the bottom portion of the folding portion 1h (or the lower face of the notch portion 1g) has a round shape, and is brought into contact with the panel FPC board 4, so as to prevent the panel FPC board 4 from breaking.

In this embodiment, the round lower face of the notch portion 1g and the folding portion 1h are arranged so that the panel FPC board 4 is held by the arc-like portion of the guide face 6c of the resin frame 6. As the panel FPC board 4 can be bent in conformity with the folding portion 1h of the upper frame 1 and the guide face 6c of the resin frame 6 as shown in FIG. 4, the panel FPC board 4 can extend toward the outside of the upper frame 1 and the lower frame 2, with the height of the panel FPC board 4 being varied to the height of the horizontal face portion 6d of the resin frame 6 (the second height) that is lower than the location of the upper face of the glass substrate 14 (the first height). As a result, when the LCD unit 60 is housed inside a resin upper chassis 50 and a resin lower chassis 51 of a mobile phone handset including the upper chassis 50 having an inner face portion protruding downward, the connector inserting portion 4g of the panel FPC board 4 is connected to the connector portion 31 of the printed circuit board 30 of the mobile phone handset, with a space being formed between electronic components 18 attached onto the upper face of the panel FPC board 4 horizontally extending outward at the second height and the inner face of the upper chassis 50 of the mobile phone handset. By virtue of the provision of the upper chassis 50 and the lower chassis 51 of the mobile phone handset, the FPC board 4 can be guided to a predetermined position by the folding portion 1h and the guide face 6c.

As described above, in this embodiment, the upper frame 1 and the resin frame 6 have the folding portion 1h and the guide face 6c that pulls the panel FPC board 4 to the outside of the upper frame 1 and the lower frame 2, with the height of the panel FPC board 4 being varied to the height of the horizontal face portion 6d of the resin frame 6 (the second height) that is lower than the location of the upper face of the glass substrate 14 (the first height) by bending the panel FPC board 4. Accordingly, the panel FPC board 4 can extend to the outside of the upper frame 1 and the lower frame 2 at the height of the horizontal face portion 6d of the resin frame 6 (the second height) that differs from the attachment position of the panel FPC board 4 to the glass substrate 14 (the first height). By virtue of the folding portion 1h and the guide face 6c for adjusting the appropriate height in conformity with the inner shapes of the upper chassis 50 and the lower chassis 51 of the mobile phone handset to which the panel FPC board 4 is mounted, the panel FPC board 4 can be prevented from coming into contact with the inner face portion of the upper chassis 50 and the inner face portion of the lower chassis 51. Thus, the electronic components 18 are prevented from coming into contact with the inner face portion of the upper chassis 50 and the inner face portion of the lower chassis 51, and the electronic components 18 can be prevented from breaking. As the folding portion 1h and the guide face 6c for pulling the panel FPC board 4 to the outside of the upper frame 1 and the lower frame 2 through bending are provided in the upper frame 1 and the resin frame 6, respectively, variations of the step position and the step shape that are observed in a case where the panel FPC board 4 is manually bent to form a step portion cannot be caused. Also, breaking can be prevented. As the folding portion 1h and the guide face 6c for pulling the panel FPC board 4 to the outside of the upper frame 1 and the lower frame 2 through bending are provided in the upper frame 1 and the resin frame 6, respectively, the folding portion 1h and the guide face 6c can prevent deformation of the panel FPC board 4. Thus, damage to the electronic components 18 can be prevented when the panel FPC board 4 returns to the original form.

In this embodiment, the horizontal face portion 6d for horizontally pulling the panel FPC board 4 outward is provided outside the arc-like portion of the guide face 6c. Accordingly, the panel FPC board 4 can be pulled toward the outside of the upper frame 1 and the lower frame 2 in conformity with the shapes of the guide face 6c and the horizontal face portion 6d. In this manner, the panel FPC board 4 can be readily pulled substantially horizontally from the upper frame 1 and the lower frame 2. When the panel FPC board 4 is in an upward or downward diagonal state, it is not pulled outward. Thus, the panel FPC board 4 can be easily prevented from coming into contact with the inner face portion of the upper chassis 50 and the inner face portion of the lower chassis 51.

Also in this embodiment, the lower face of the folding portion 1h has a round shape, and the upper face of the guide face 6c has an arc-like portion that is concaved downward in conformity with the round-shaped lower face of the folding portion 1h. Accordingly, the panel FPC board 4 cannot be damaged by the folding portion 1h and the guide face 6c in contact with the panel FPC board 4. Also, the lower face of the folding portion 1h has a round shape, and the upper face of the guide face 6c has an arc-like portion that is concaved downward in conformity with the round-shaped portion of the folding portion 1h, so that the panel FPC board 4 is interposed between the round-shaped lower face of the folding portion 1h of the upper frame 1 and the arc-like concave portion of the guide face 6c of the resin frame 6 in conformity with the round-shaped lower face of the folding portion 1h. Thus, the panel FPC board 4 can be readily pulled to the outside of the upper frame 1 and the lower frame 2, with the height of the panel FPC board 4 being varied from the height of the upper face of the glass substrate 14 (the first height) to the height of the horizontal face portion 6d of the resin frame 6 (the second height), which is lower than the upper face of the glass substrate 14.

Also in this embodiment, the folding portion 1h of the upper frame 1 is folded inward so that the lower face of the folding portion 1h has a round shape. Accordingly, the round-shaped portion of the folding portion 1h to be brought into contact with the panel FPC board 4 can be easily formed. Thus, damage to the panel FPC by the folding portion 1h can be easily prevented.

Also in this embodiment, the panel FPC board 4 is bent in conformity with a flat face portion 1i and the round-shaped lower face of the folding portion 1h, so that the panel FPC board 4 can be easily varied from the height of the upper face of the glass substrate (the first height) to the height of the horizontal face portion 6d of the resin frame 6 (the second height).

Also in this embodiment, the resin frame 6 is made of resin, and the guide face 6c is integrally formed with the resin frame 6. Accordingly, the guide face 6c can be provided to the resin frame 6, without an increase in the number of components. Furthermore, the guide face 6c integrally formed with the resin frame 6 can be easily produced by resin molding.

Also in this embodiment, the facing portion 1d of the upper frame 1 facing the driver IC 17 has a concave shape, so that the distance between the driver IC 17 and the facing portion 1d of the upper frame 1 can be made longer. Accordingly, the driver IC 17 can be prevented from coming into contact with the facing portion 1d of the upper frame 1 due to impact or vibration. Thus, damage to the driver IC 17 can be prevented, and defective display cannot be caused by damage to the driver IC 17. Further, the driver IC 17 is attached to the surface of the glass substrate 14. Accordingly, the panel FPC board 4 can be made smaller than in a case where the driver IC 17 is attached to the panel FPC board 4.

Also in this embodiment, the facing portion 1d of the upper frame 1 has a smaller thickness (approximately 0.2 mm) than the thickness of the rest of the upper frame 1 (approximately 0.4 mm). Accordingly, the facing portion 1d of the upper frame 1 facing the driver IC 17 can easily have a concave portion, and the distance between the driver IC 17 and the facing portion 1d of the upper frame 1 can be easily made longer. Thus, the driver IC 17 can be certainly prevented from coming into contact with the facing portion 1d of the upper frame 1 due to impact or vibration, and damage to the driver IC 17 can be surely avoided.

Also in this embodiment, the buffer member 20 made of a sponge material is interposed between the driver IC 17 and the facing portion 1d of the upper frame 1. Even if the driver IC 17 comes close to the facing portion 1d of the upper frame 1, the buffer member 20 reduces impact or vibration to be applied to the driver IC 17. Thus, damage to the driver IC 17 can be more effectively prevented.

Also in this embodiment, the buffer member 20 is attached to the facing portion 1d of the upper frame 1 via an adhesive layer. In this arrangement, the buffer member 20 can be prevented from moving toward the facing portion 1d of the upper frame 1.

Also in this embodiment, the drawing process for reducing the thickness of the facing portion 1d of the upper frame 1 is carried out at the same time as the process for forming the rest of the upper frame 1. Accordingly, it is not necessary to carry out a drawing process separately from the process for forming the upper frame 1, and an increase in the number of procedures for forming the upper frame 1 can be prevented. Thus, the process for forming the upper frame 1 is not complicated, and an increase in the production cost of the upper frame 1 can be prevented.

It should be understood that the above described embodiment is merely an example in all aspects and does not limit the scope of the present invention. The scope of the present invention is shown by the claims, instead of the above described embodiment. Any modification can be made to the above described embodiment within the spirit and scope of the present invention.

For example, although the present invention is applied to a LCD unit as a display in the above embodiment, it may be applied to any other display such as an organic EL display unit, as long as the display has a display panel.

Also, the LCD unit is mounted in a mobile device in the above described embodiment, but the present invention is not limited to that. It is possible to mount the LCD unit in a mobile information terminal such as a PDA (Personal Digital Assistant), a mobile personal computer, an electronic dictionary, a portable video game machine, or a portable navigation system. It is also possible to mount the LCD unit in a device that is not a mobile device.

Although the bending portions 4a, 4d, and 4f of the panel FPC board 4 are shown as not being bent in the above embodiment, the present invention is not limited to that structure. FIGS. 12 through 17 illustrate first through third modifications of the above embodiment of the present invention. As in the first modification illustrated in FIGS. 12 and 13, the bending portion 4a of the panel FPC board 4 of the LCD unit 60 may be bent, and the connector inserting portion 4g of the panel FPC board 4 extending in the bending direction may be connected to the connector portion 31a of the printed circuit board 30 of a mobile phone handset. In this case, the panel FPC board 4 of the LCD unit 60 may be disposed below the lower frame 2 of the LCD unit 60. As in the second modification illustrated in FIGS. 14 and 15, the bending portions 4a and 4f of the panel FPC board 4 of the LCD unit 60 may be bent, but the bending portion 4d (see FIG. 14) of the panel FPC board 4 may not be bent. In this structure, the panel FPC board 4 can be inserted to a connector portion 31b opposed to the connector portion 31a of the printed circuit board 30 of the mobile phone handset shown in FIGS. 12 and 13. As in the third modification illustrated in FIGS. 16 and 17, the bonding portions 4a and 4f (see FIG. 16) of the panel FPC board 4 of the LCD unit 60 are not bent, but only the bending portion 4d may be bent. In this structure, the electronic components 18 can be disposed on and under the panel FPC board 4 of the LCD unit 60. Also, as the bending portion 4d of the panel FPC board 4 of the LCD unit 60 is bent, so that the electronic component attaching portion 4c is disposed below the electronic component attaching portion 4b. Accordingly, the electronic component attaching portion 4c does not overlap the upper portion of the printed circuit board 30 of the mobile phone handset. Thus, the area that can serve as the circuit region of the printed circuit board 30 of the mobile phone handset can be increased.

Figure 18:
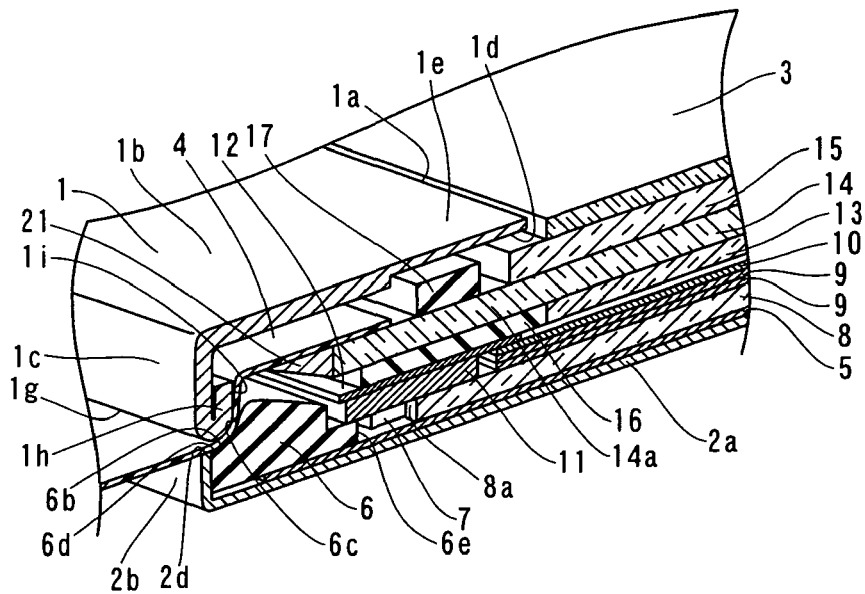
FIG. 18 is a perspective cross-sectional view of a LCD unit in accordance with a fourth modification of the embodiment of the present invention.
Figure 19:
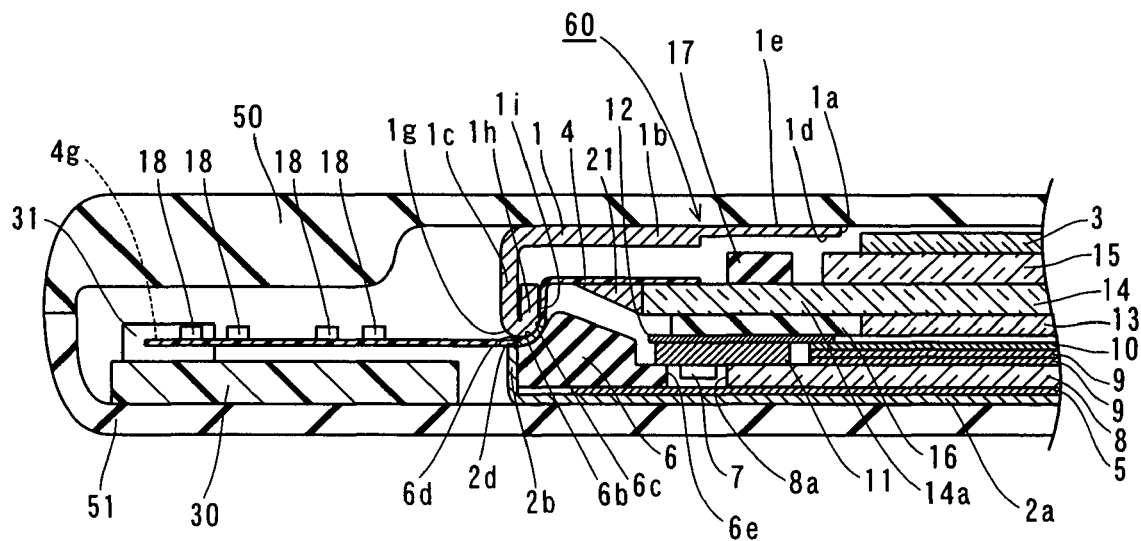
FIG. 19 is a perspective view of the LCD unit in accordance with the fourth modification, where the LCD unit is disposed inside the chassis of a mobile phone handset.
Figure 20:
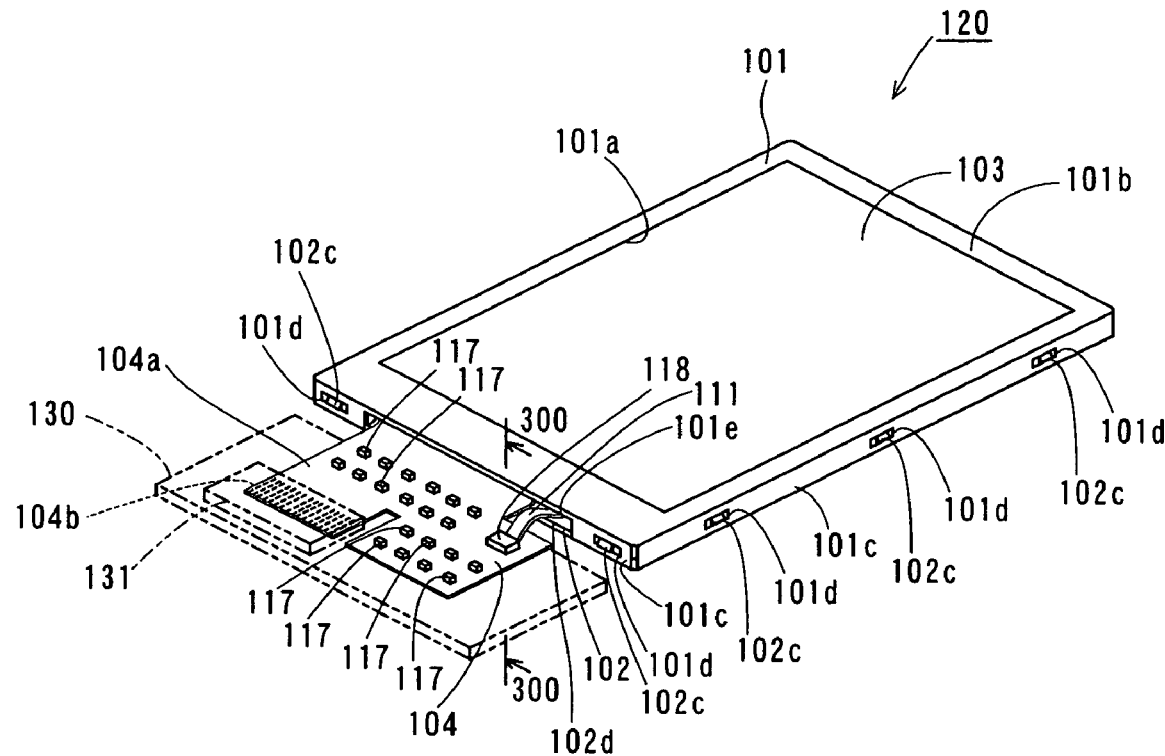
FIG. 20 is a perspective view of a conventional LCD unit that has a driver IC attached to the display panel.
Figure 21:
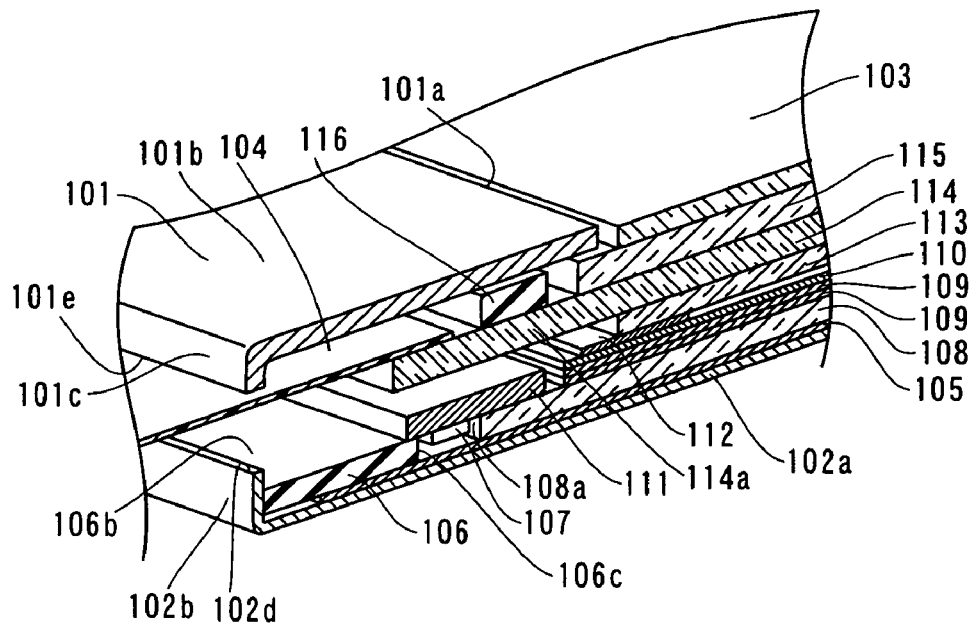
FIG. 21 is a perspective cross-sectional view of the LCD unit, taken along the line 300-300 of FIG. 20.
Figure 22:
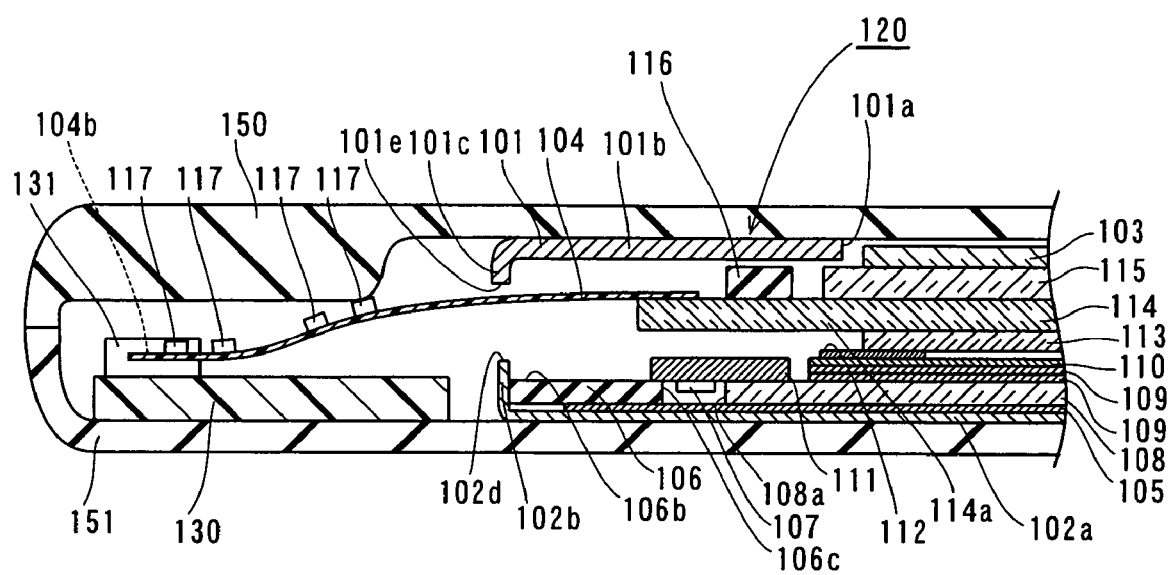
FIG. 22 is a cross-sectional view of the conventional LCD unit shown in FIG. 20, where the LCD unit is disposed inside a mobile phone handset.
Figure 23:
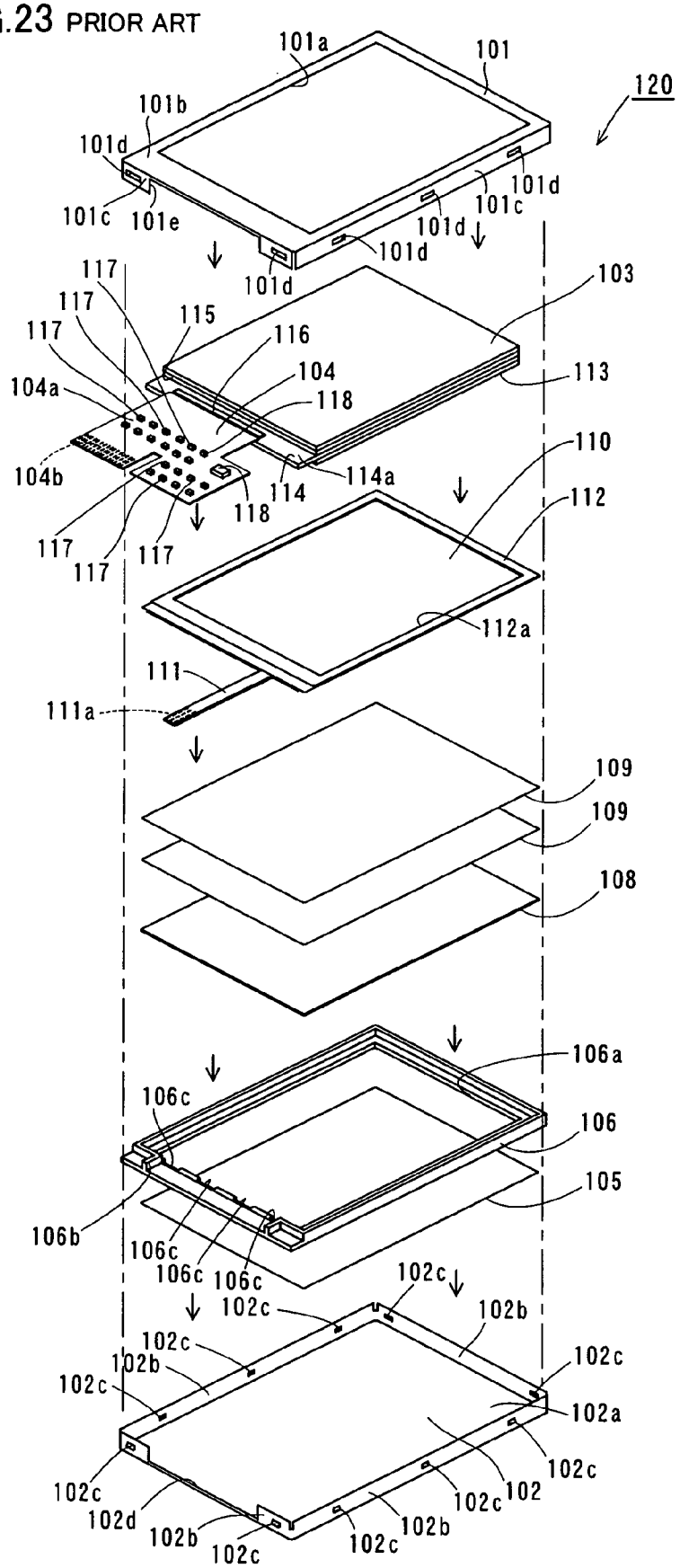
FIG. 23 is an exploded perspective view of the conventional LCD unit shown in FIG. 20.
Figure 24:
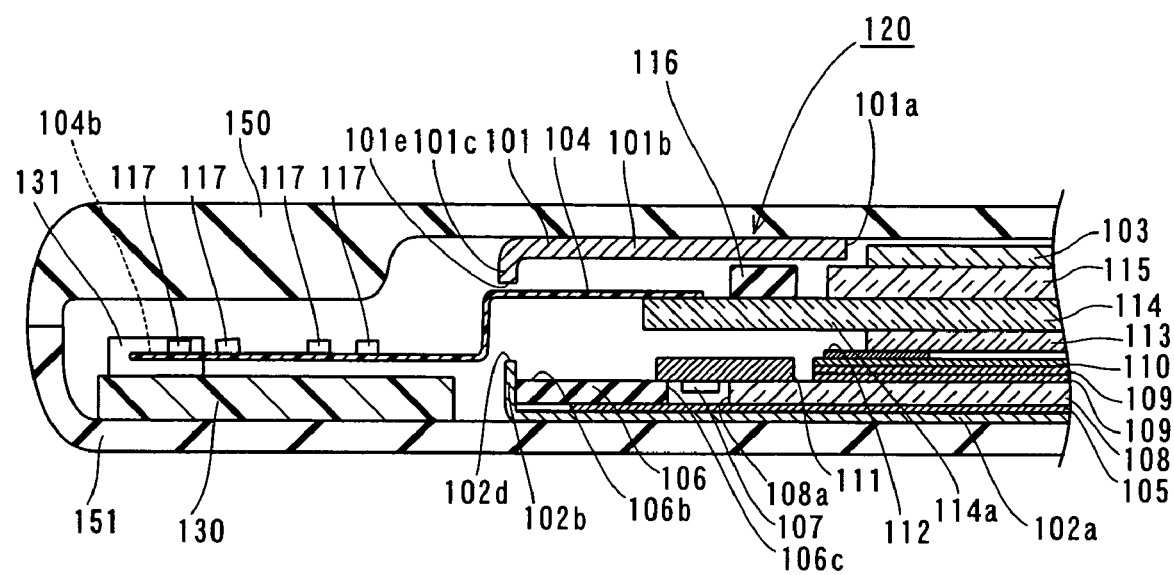
FIG. 24 is a cross-sectional view illustrating the problems with the conventional LCD unit shown in FIG. 20.

Although the buffer member is interposed between the driver IC and the facing portion of the upper frame in the above embodiment, the present invention is not limited to that structure. As in a fourth modification illustrated in FIGS. 18 and 19, a buffer member may not be interposed between the driver IC 17 and the facing portion 1d of the upper frame 1. In this structure, the facing portion 1d of the upper frame 1 having a concave shape widens the distance between the driver IC 17 and the facing portion 1d of the upper frame 1. Accordingly, the driver IC 17 cannot be brought into contact with the facing portion 1d of the upper frame 1 due to impact or vibration. Thus, damage to the driver IC 17 can be prevented, and defective display due to the damage to the driver IC 17 cannot be caused.

Also, the four LEDs are employed, and the four concave portions for accommodating the LEDs are formed in the resin frame in the above described embodiment. However, the number of LEDs and the number of concave portions are not limited to four in the present invention. The number of LEDs and the number of concave portions to be formed in the resin frame may be less than four or more than four. In any case, it is preferable to employ two or more LEDs and to form two or more concave portions in the resin frame.

Although the upper face of the driver IC is designed to bite into the lower face of the buffer member in the above described embodiment, the present invention is not limited to that structure. The upper face of the driver IC may not bite into the lower face of the buffer member.

What is claimed is:

1. A display comprising:
a display panel;
a flexible printed circuit board that is attached to said display panel at a first height; and
a frame that has said display panel disposed therein, wherein
said frame comprises a guide portion that guides said flexible printed circuit board to the outside of said frame, with the height of said flexible printed circuit board being varied from said first height to a second height by bending said flexible printed circuit board, and
wherein said guide portion has a portion to be in contact with a bent portion of said flexible printed circuit board, said portion having a curved shape.

2. The display as claimed in claim 1, wherein said flexible printed circuit board comprises a connector inserting portion, a first bending portion that is formed on the side of said display panel, and a second bending portion that is formed between said connector inserting portion and said first bending portion.

3. The display as claimed in claim 2, wherein said flexible printed circuit board further comprises a first electronic component attaching portion and a second electronic component attaching portion to which electronic components are to be attached, and a third bending portion that is formed between said first electronic component attaching portion and said second electronic component attaching portion.

4. The display as claimed in claim 3, wherein said flexible printed circuit board further comprises a slit that is formed between said connector inserting portion and said second electronic component attaching portion.

5. A display comprising:
a display panel;
a flexible printed circuit board that is attached to said display panel at a first height; and
a frame that has said display panel disposed therein, wherein
said frame comprises a guide portion that guides said flexible printed circuit board to the outside of said frame, with the height of said flexible printed circuit board being varied from said first height to a second height by bending said flexible printed circuit board,
said frame further comprises a first frame and a second frame that are disposed above and below said flexible printed circuit board;
said guide portion comprises a first guide portion that is formed in said upper first frame, and a second guide portion that is formed in said lower second frame; and
said flexible printed circuit board is interposed between said first guide portion and said second guide portion, so that said flexible printed circuit board is guided to the outside of said frame, with the height of said flexible printed circuit board being varied from said first height to said second height through bending,
said first guide portion has a lower face with a round shape; and
said second guide portion has an upper face including an arc-like portion that is concaved downward in conformity with the round shape of the lower face of said first guide portion.

6. The display as claimed in claim 5, wherein said second guide portion has a horizontal face portion outside the arc-like portion, said horizontal face portion serving to horizontally guide said flexible printed circuit board outward.

7. The display as claimed in claim 5, wherein:
said first frame is made of metal; and
said first guide portion of said first frame is bent inward so as to have the round lower face.

8. The display as claimed in claim 7, wherein:
said first guide portion of said first frame has a flat face portion at the end of the bent portion; and
said flexible printed circuit board is bent in conformity with the flat face portion and the round lower face of said first guide portion.

9. A mobile device comprising
a display that comprises:
a display panel;
a flexible printed circuit board that is attached to said display panel at a first height; and
a frame that has said display panel disposed therein, wherein
said frame comprises a guide portion that guides said flexible printed circuit board to the outside of said frame, with the height of said flexible printed circuit board being varied from said first height to a second height by bending said flexible printed circuit board, and
said guide portion has a portion to be in contact with a bent portion of said flexible printed circuit board, said portion having a curved shape.

10. The mobile device as claimed in claim 9, further comprising:
chassis that house said display inside; and
a printed circuit board that is disposed inside said chassis, wherein
said flexible printed circuit board of said display comprises a connector inserting portion, and
said printed circuit board comprises a connector portion to which said connector inserting portion of said flexible printed circuit board is connected.

11. The mobile device as claimed in claim 10, wherein:
an electronic component is mounted to said flexible printed circuit board; and
a space is formed between said electronic component and said inner portion of said chassis.

12. A display comprising:
a display panel;
a first electronic component that is attached to a surface of said display panel; and
a frame that secures the display panel, wherein
a portion of said frame facing said first electronic component is disposed at a predetermined distance from said first electronic component, said facing portion having a concave shape.

13. The display as claimed in claim 12, wherein said facing portion of said frame is thinner than the rest of said frame.

14. The display as claimed in claim 12, wherein:
said display panel has a display region;
said frame comprises:
an upper face portion that has an opening at the location corresponding to said display region of said display panel, and is formed to cover the hems of the upper face of said display panel; and
a side face portion that is formed to cover the side portion of said display panel; wherein
said concave facing portion of said frame is formed on the lower side of upper face portion of said frame.

15. The display as claimed in claim 14, wherein the upper face portion of said frame below which said concave facing portion is formed has a flat face portion formed on the upper side thereof.

16. The display as claimed in claim 12, wherein a buffer member is provided between said first electronic component and the facing portion of said frame.

17. The display as claimed in claim 16, wherein said buffer member is made of a sponge material.

18. The display as claimed in claim 16, wherein said buffer member is attached to said facing portion of said frame via an adhesive layer.

19. The display as claimed in claim 12, wherein:
said display panel has a display region;
the display further comprises a deflecting plate that is disposed on the surface of said display region of said display panel; and
said first electronic component is disposed in a region other than the region in which said deflecting plate is located on the surface of said display panel.

20. The display as claimed in claim 12, further comprising a flexible printed circuit board that is attached to said display panel and is electrically connected to said first electronic component,
wherein said flexible printed circuit board comprises: a connector inserting portion; a first bending portion that is disposed on a side of said display panel; and a second bending portion that is interposed between said connector inserting portion and said first bending portion.

21. The display as claimed in claim 20, wherein said flexible printed circuit board further comprises: a first electronic component attaching portion and a second electronic component attaching portion to which a second electronic component is attached; and a third bending portion that is formed between said first electronic component attaching portion and said second electronic component attaching portion.

22. The display as claimed in claim 21, wherein said flexible printed circuit board further comprises a slit that is formed between said connector inserting portion and said second electronic component attaching portion.

23. The display as claimed in claim 20, further comprising a frame that houses the display panel,
wherein:
said frame comprises a first guide portion and a second guide portion that guides said flexible printed circuit board to the outside of said frame;
said first guide portion is in contact with an upper face of said flexible printed circuit board; and
said second guide portion is in contact with a lower face of said flexible printed circuit board.

24. A mobile device comprising
a display that comprises:
a display panel;
a first electronic component that is attached to a surface of said display panel; and
a frame that secures said display panel, wherein
a portion of the frame facing said first electronic component is disposed at a predetermined distance from said first electronic component, said facing portion having a concave shape.

* * * * *